(12) United States Patent
Higgins et al.

(10) Patent No.: US 12,199,091 B2
(45) Date of Patent: Jan. 14, 2025

(54) SHALLOW TRENCH ISOLATION PROCESSING WITH LOCAL OXIDATION OF SILICON

(71) Applicant: Texas Instruments Incorporated, Dallas, TX (US)

(72) Inventors: Robert Martin Higgins, Plano, TX (US); Xiaoju Wu, Dallas, TX (US); Li Wang, Plano, TX (US); Venugopal Balakrishna Menon, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/503,877

(22) Filed: Oct. 18, 2021

(65) Prior Publication Data
US 2022/0367444 A1 Nov. 17, 2022

Related U.S. Application Data

(60) Provisional application No. 63/187,968, filed on May 13, 2021.

(51) Int. Cl.
*H01L 21/00* (2006.01)
*H01L 21/762* (2006.01)
(Continued)

(52) U.S. Cl.
CPC .... *H01L 27/0629* (2013.01); *H01L 21/76202* (2013.01); *H01L 28/20* (2013.01); *H01L 28/60* (2013.01)

(58) Field of Classification Search
CPC ........... H01L 27/0629; H01L 21/76202; H01L 28/20; H01L 28/60
See application file for complete search history.

(56) References Cited

U.S. PATENT DOCUMENTS 6,825,544 B1  11/2004  Jin
9,431,286 B1   8/2016  Pendharkar
(Continued)

FOREIGN PATENT DOCUMENTS

EP       3764391 A1    1/2021
KR   20060128392 A    12/2006

OTHER PUBLICATIONS

Cheng K et al.: "Bottom oxidation through STI (BOTS)—A novel approach to fabricate dielectric isolated FinFETs on bulk substr", 2015 Symposium on VLSI Technology, IEEE, Jun. 9, 2014 (Jun. 9, 2014), pp. 1-2, XP032640210, ISSN: 0743-1562, DOI: 10.1109/VLSIT.2014.6894390 [retrieved on Sep. 8, 2014] abstract; figures.

(Continued)

*Primary Examiner* — Richard A Booth
(74) *Attorney, Agent, or Firm* — Yudong Kim; Frank D. Cimino

(57) ABSTRACT

A method of manufacturing an electronic device includes forming a shallow trench isolation (STI) structure on or in a semiconductor surface layer and forming a mask on the semiconductor surface layer, where the mask exposes a surface of a dielectric material of the STI structure and a prospective local oxidation of silicon (LOCOS) portion of a surface of the semiconductor surface layer. The method also includes performing an oxidation process using the mask to oxidize silicon in an indent in the dielectric material of the STI structure and to grow an oxide material on the exposed LOCOS portion of the surface of the semiconductor surface layer.

22 Claims, 22 Drawing Sheets

(51) Int. Cl.
   *H01L 27/06*       (2006.01)
   *H01L 49/02*       (2006.01)

(56)          References Cited
                U.S. PATENT DOCUMENTS

2005/0153521  A1    7/2005   Kanamitsu et al.
2006/0160326  A1    7/2006   Lee
2009/0250784  A1   10/2009   Meinel et al.
2017/0066944  A1*   3/2017   Cui .................... C09K 3/1463
2018/0342416  A1   11/2018   Sucher
2020/0203230  A1    6/2020   Chatterjee et al.
2021/0005760  A1    1/2021   Hu

OTHER PUBLICATIONS

PCT International Search Report, International Application No. PCT/US2022/028897, International Filing Date: May 12, 2022, Priority Date: May 13, 2021, Search Completion Date: Aug. 11, 2022, ISR dated Aug. 25, 2022, Applicant: Texas Instruments Incorporated.

* cited by examiner

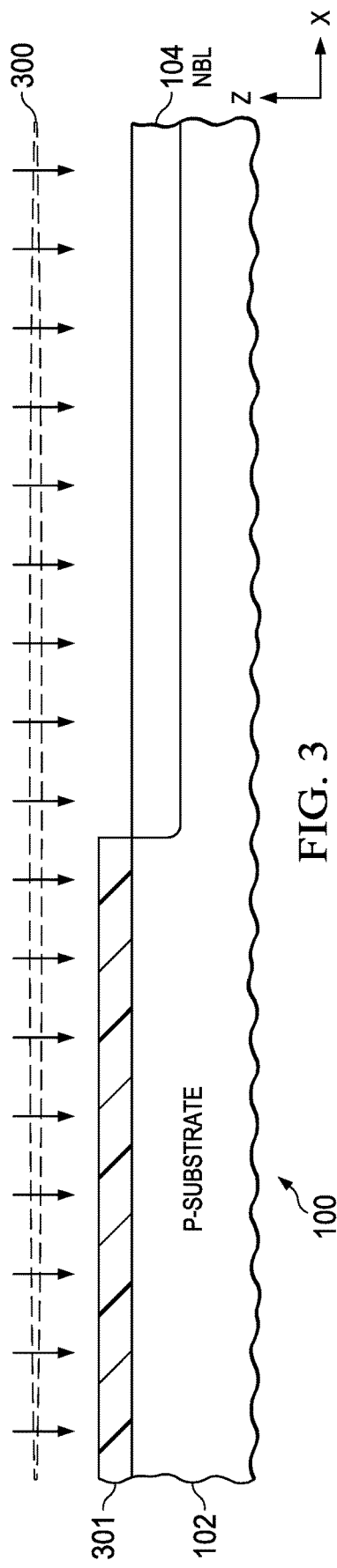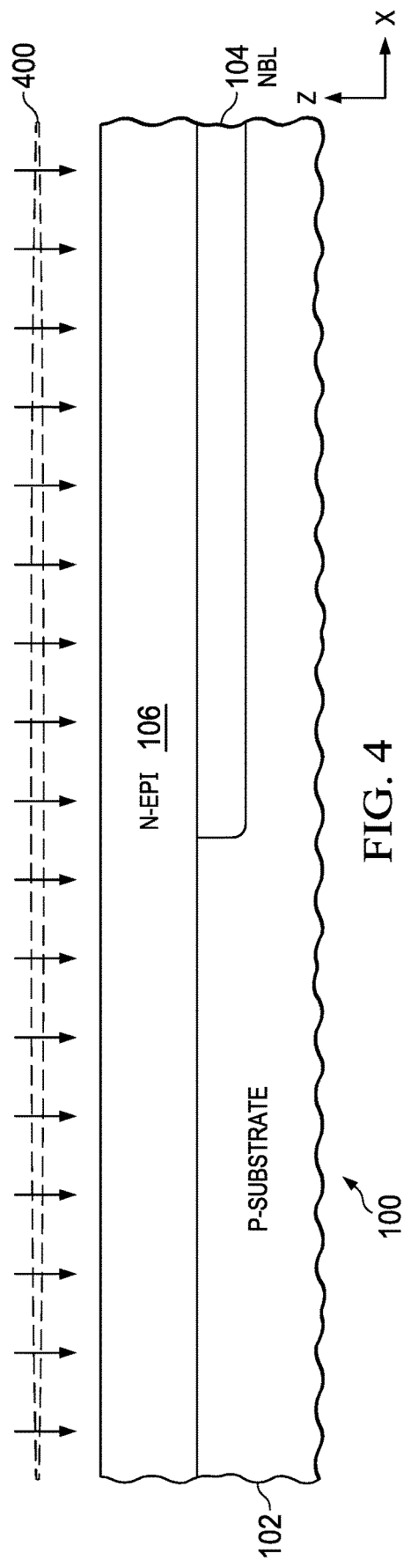

us 12,199,091 B2

SHALLOW TRENCH ISOLATION PROCESSING WITH LOCAL OXIDATION OF SILICON

CROSS-REFERENCE TO RELATED APPLICATION

This application claims priority to and benefit of U.S. Provisional Patent Application Ser. No. 63/187,968, filed on May 13, 2021, and titled "Method to Build Highly Reliable Semiconductor Components in STI Technology using LOCOS Process", the contents of which are hereby fully incorporated by reference.

BACKGROUND

Defects in shallow trench isolation (STI) structures can affect components in an integrated circuit or other packaged electronic device. Cone defects in the STI are caused by particles of nitride remaining after STI trench etching, which can create a region of crystalline silicon which unintentionally did not get etched. Polysilicon resistors or capacitors formed over STI are susceptible to oxide stress failures if a cone defect is present under these components.

SUMMARY

In one aspect, an electronic device includes a semiconductor surface layer, a shallow trench isolation (STI) structure, and a passive circuit component. The semiconductor surface layer extends in a plane of orthogonal first and second directions. The STI structure has a dielectric material in a trench of the semiconductor surface layer. The dielectric material has a first side, a second side, and an indent. The first side is on a surface of the trench, and the first side is spaced apart from the second side along a third direction orthogonal to the first and second directions. The indent extends into the first side along the third direction and is filled with material of the semiconductor surface layer. An end of the indent is spaced apart from the second side along the third direction by a gap distance of 20 nm or more, and the gap distance is less than a thickness of the dielectric material along the third direction. The passive circuit component has a doped poly silicon structure on the second side of the dielectric material.

In another aspect, a method of manufacturing an electronic device includes forming a shallow trench isolation (STI) structure on or in a semiconductor surface layer, forming a mask on the semiconductor surface layer, the mask exposing a surface of a dielectric material of the STI structure, and performing an oxidation process using the mask to oxidize silicon in an indent in the dielectric material of the STI structure.

In another aspect, a method includes forming a shallow trench isolation (STI) structure on or in a semiconductor surface layer, oxidizing a side of the STI structure, and after oxidizing the side of the STI structure, forming a doped polysilicon structure on the side of the STI structure.

BRIEF DESCRIPTION OF THE DRAWINGS

FIGS. 3-21 are partial sectional side elevation views of the electronic device of FIG. 1 undergoing fabrication processing according to the method of FIG. 2.

DETAILED DESCRIPTION

Figure 1:
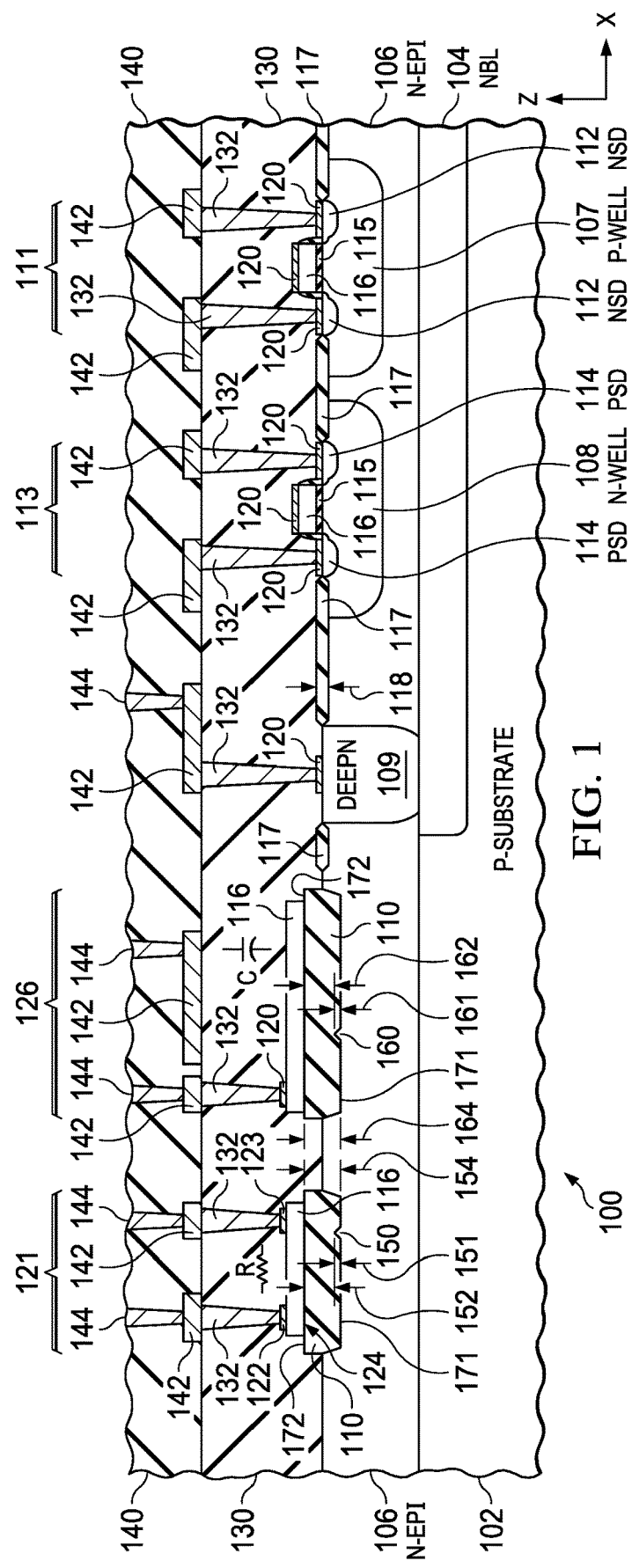
FIG. 1 is a partial sectional side elevation view of an electronic device with metal silicide passive circuit components on an isolation structure.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows an electronic device 100 with passive resistor and capacitor components having doped polysilicon structures on an STI isolation structure. The electronic device 100 in one example is an integrated circuit product, only a portion of which is shown in FIG. 1. The electronic device 100 includes electronic components, such as transistors, resistors, capacitors (not shown) fabricated on or in a semiconductor structure of a starting wafer, which is subsequently separated or singulated into individual semiconductor dies that are separately packaged to produce integrated circuit products. In another example, the electronic device has a single electronic component, such as a resistor or a capacitor. As illustrated in FIG. 1, the electronic device 100 includes a semiconductor structure having a semiconductor substrate 102, a buried layer 104 in a portion of the semiconductor substrate 102, a semiconductor surface layer 106 with an p-doped well or region 107 (e.g., labeled "P-WELL"), an n-doped well or region 108 (e.g., labeled "N-WELL"), in an upper or top side, a deep doped region 109, and STI structures 110 that extend into corresponding portions of the top side of the semiconductor surface layer 106. Other semiconductor structures that incorporate STI structures 110 may alternatively be used. The STI structures 110 are or include a dielectric material such as silicon dioxide (e.g., $SiO_2$) on or in a trench of the semiconductor surface layer 106, for example, $SiO_2$ deposited into previously formed trenches that extend into the semiconductor surface layer 106 during fabrication of the electronic device 100.

The semiconductor substrate 102 in one example is a silicon or silicon on insulator (SOI) structure that includes majority carrier dopants of a first conductivity type. The buried layer 104 extends in a portion of the semiconductor substrate 102 and includes majority carrier dopants of a second conductivity type. In the illustrated implementation, the first conductivity type is P, the second conductivity type is N, the semiconductor substrate 102 is labeled "P-SUBSTRATE", and the buried layer 104 is an N-type buried layer labeled "NBL" in the drawings. In another implementation (not shown), the first conductivity type is N, and the second conductivity type is P. The semiconductor surface layer 106 in the illustrated example is or includes epitaxial silicon having majority carrier dopants of the second conductivity type and is labeled "N-EPI" in the drawings. Alternatively, semiconductor surface layer 106 may have majority carrier dopants of the first conductivity type in which case PWELL 107 can, in some cases, be omitted. The deep doped region 109 includes majority carrier dopants of the second conductivity type and is labeled "DEEPN" in the drawings. The deep doped region 108 extends from the semiconductor surface layer 106 to the buried layer 104.

The example electronic device 100 includes an optional n-channel field effect transistor 111 (e.g., FET or NMOS) with source/drain implanted portions 112 (e.g., a first implanted region) of the semiconductor surface layer 106 along the top side in the p-doped well 107, which include majority carrier dopants of the second conductivity type (e.g., labeled "NSD"). The electronic device 100 also includes an optional p-channel FET 113 having source/drain implanted portions 114 along the top side of the semiconductor surface layer 106 in the n-doped well 108. The source/drain implanted portions 114 include majority carrier dopants of the first conductivity type (e.g., labeled "PSD"). The individual transistors 111 and 113 each have gate dielectric (e.g., gate oxide) layer 115 formed over a channel region laterally between the respective source/drain implanted portions 112 and 114, as well as a doped polysilicon structures 116 on the gate dielectric 115 and doped polysilicon structures 116 forming passive circuit components or parts thereof on respective STI structures 110.

The electronic device 100 also include local oxidation of silicon (LOCOS) isolation structures 117 formed on or in the semiconductor surface layer 106. The LOCOS structures 117 are laterally spaced apart from the STI structures 110 (e.g., along the X and/or Y directions). The individual LOCOS structures 117 have a thickness 118 along the third direction Z. The electronic device 100 includes metal silicide structures 120 on an upper side of the isolation structure 110, as well as metal silicide structures 120 that extend over and provide electrical connection to the source/drain implanted portions 112 and 114 and to the gate electrodes 116.

The electronic device 100 includes one or more types of passive circuit components that have a respective one of the metal silicide structures 120. A resistor 121 in this example has a first resistor terminal 122, a second resistor terminal 123 and a resistor body 124. The first and second resistor terminals 122 and 123 are located on laterally opposite sides of the resistor body 124. The electronic device 100 also includes a capacitor 126 as shown in FIG. 1. FIG. 1 also includes schematic symbol representations of the resistor 121 with a resistance R, and the capacitor 126 with a capacitance C.

The electronic device 100 includes a multilevel metallization structure, only a portion of which is shown in the drawings. A first dielectric layer 130 (e.g., a pre-metal dielectric layer labeled "PMD" in the drawings) extends on or over the shallow trench isolation structure 110, the transistors 111 and 113, and portions of the top side of the semiconductor surface layer 106. In one example, the first dielectric layer is or includes SiO₂. The dielectric layer 130 includes conductive contacts 132 (e.g., tungsten) that extend through the dielectric layer 130 to form electrical contacts to the metal silicide structure 120 of the respective implanted regions 112, 114, and gate contacts 116 of the semiconductor surface layer 106. The dielectric layer 130 also includes conductive contact 132 that form electrical contact to the passive components 121, 126.

The multilevel metallization structure also includes a second dielectric layer 140 (e.g., SiO₂), referred to herein as an interlayer or interlevel dielectric (ILD) layer (e.g., labeled "ILD"). The second dielectric layer 140 includes conductive routing structures 142, such as traces or lines. In one example, the conductive routing structures 142 are or include copper or aluminum or aluminum or other conductive metal. The second dielectric layer 140 includes conductive vias 144 that are or include copper or aluminum or other conductive metal. In one example, the electronic device 100 includes one or more further metallization layers or levels (not shown) above the second dielectric layer 140.

A first contact 132 of the PMD dielectric layer 130 contacts the first resistor terminal 122 and a second contact 132 of the PMD dielectric layer 130 contacts the second resistor terminal 123. The electrical connections to the first and second resistor terminals 122 and 123 couple the resistor terminals to a circuit of the electronic device 100 by interconnections of the multilevel metallization structure. One or more of the passive component terminals can be connected to externally exposed pads or terminals of a finished packaged electronic device through signal routing of the multilevel metallization structure. The resistor 121 is a continuous doped polysilicon structure 116 with metal silicide contact structures 122 and 123 that form resistor terminals at or near the lateral ends of the doped polysilicon structure 116 to provide a resistance R between the associated contacts 132.

The semiconductor surface layer (106) extending in a plane of orthogonal first and second directions. FIG. 1 shows an example first direction labeled "X", and the orthogonal second direction in the illustrated configuration is designated "Y" (e.g., into the page in the device orientation of FIG. 1, shown in the perspective view of FIG. 22 below). FIG. 1 further shows a third direction labeled "Z" that is orthogonal to both the first and second directions X and Y. The individual STI structures 110 have a dielectric material (e.g., SiO₂) in a trench of the semiconductor surface layer 106. The STI dielectric material of the STI structure 110 has a bottom or first side 171, a top or second side 172, and an indent. The STI structure 110 of the resistor 121 has an indent 150 with a Z-direction height 151. The height 151 of the indent 150 defines a gap distance 152 between an upper end of the indent 150 and the second side 172 of the STI structure 110 along the third direction Z. In this example, the STI structure 110 of the capacitor component 126 has an indent 160 with a height 161. The height 161 of the indent 160 defines a gap distance 162 between an upper end of the indent 160 and the second side 172 of the STI structure 110 of the capacitor 126 along the third direction Z. The bottom or first sides 171 of the STI structures 110 extends on a surface at the bottom of the associated the trench. The first side 171 and the second side 172 of the respective STI structures 110 are spaced apart from one another along the third direction Z to define a Z-direction thickness 154 of the STI structure 110 below the resistor 121 and a thickness 164 of the STI structure 110 below the capacitor component 126. In one example, the thicknesses 154 and 164 are 350 nm or more, such as approximately 380 nm, for example, within a tolerance of the STI process used to form the STI structures 110.

The indents 150 and 160 extend into the first sides 171 of the respective STI structures 110 along the third direction Z. The indents 150 and 160 are filled with material (e.g., epitaxially grown generally crystalline silicon) of the semiconductor surface layer 106. The illustrated indents 150 and 160 have generally conical or tapered shapes, although other examples can have different shapes. As described further below, the indents 150 and 160 in one example are formed during the STI etch, when a particle (e.g., a nitride particle or particles) is in the area to be etched. In one example, a portion of a nitride trench etch mask is not completely removed, and the trench formation etch chemistry and process does not etch the silicon of the semiconductor surface layer 106 properly below the particle and a cone forms. The cone in this example is crystalline silicon which unintentionally did not get etched. For the STI structures 110, subsequent deposition of dielectric (e.g., $SiO_2$) in the trench forms the STI structure 110 with the indents 150 and 160 filled with crystalline silicon that was not etched during trench formation.

The doped polysilicon 116 of the resistor 121 and of the capacitor 126 extend above the tops of the respective indents 150 and 160 and are spaced therefrom by the respective gap distances 152 and 162. The doped polysilicon structure 116 of the capacitor 126 forms a bottom or lower capacitor plate of the capacitor 126. A patterned conductive feature 142 of the ILD dielectric layer 140 forms a conductive second (e.g., upper) capacitor plate. A portion of the PMD dielectric layer 130 extends between the first and second capacitor plates to form a capacitor structure with a capacitance C. A first contact 132 of the PMD dielectric layer 130 contacts the lower first capacitor plate and a conductive via 144 of the ILD dielectric layer 140 contacts the upper second capacitor plate.

The gap distances 152 and 162 are less than the respective STI structure thicknesses 154 and 164. In one example, the thickness 118 of the LOCOS structures 117 is greater than the gap distances 152 and 162. Taller indents 150 and 160 and corresponding smaller gap distances 152 and 162 reduce the breakdown voltage performance between the passive components 121 and 126 and the substrate and silicon of the semiconductor surface layer 106, where thin oxide between the top of the indent 150, 160 may break down and create a leakage path between polysilicon structure 116 and the silicon in the indent 150, 160. In one example, the gap distances 152 and 162 are 20 nm or more, and the gap distances 152 and 162 are less than the respective thicknesses 154 and 164 of the dielectric material of the STI structures 110 along the third direction Z. In one example, the gap distances 152 and 162 are 50 nm or more.

Referring also to FIGS. 2-22, FIG. 2 shows a method 200 for fabricating an electronic device and for making a passive circuit component in an electronic device. FIGS. 3-21 show the electronic device 100 of FIG. 1 at various stages of fabrication according to the method 200, and 22 shows a perspective view of the final packaged electronic device 100. The method 200 includes forming the STI structure 110 on or in the semiconductor surface layer 106 and oxidizing the second (e.g., upper) sides 172 of the STI structures 110 prior to forming the doped polysilicon structures 116 on the sides 172 of the STI structures 110. The oxidation of the STI structures 110 in one example concurrently grows the LOCOS structures 117, and oxidizes silicon in the indents 150 and 160, which consumes silicon and reduces the gap distances 152 and 162 prior to formation of the doped polysilicon structures 116.

This processing improves breakdown voltage performance of the passive components 121 and 126 without adding any additional masks or processing cost. In one implementation, the LOCOS mask is modified to expose all or portions of the second side 172 of the STI structures 110, and the LOCOS oxidation processing increases the gap distances 152 and 162 by approximately half the LOCOS structure thickness 118. The LOCOS process in one example grows approximately 100 nm (e.g., 1000A) of oxide (e.g., $SiO_2$) in forming the LOCOS structures 117, which consumes approximately 50 nm (500A) of silicon from the silicon in the indents 150, 160. This increases the gap distances 152 and 162 and reduces the heights 151 and 161 of the respective indents 150 and 160. resulting in thicker STI oxide between tops of the indents 150, 160 and the subsequently formed doped polysilicon structures 116. This indent height reduction means that the electric field across the oxide is lower in operation, and oxide breakdown is less likely.

Figure 2:
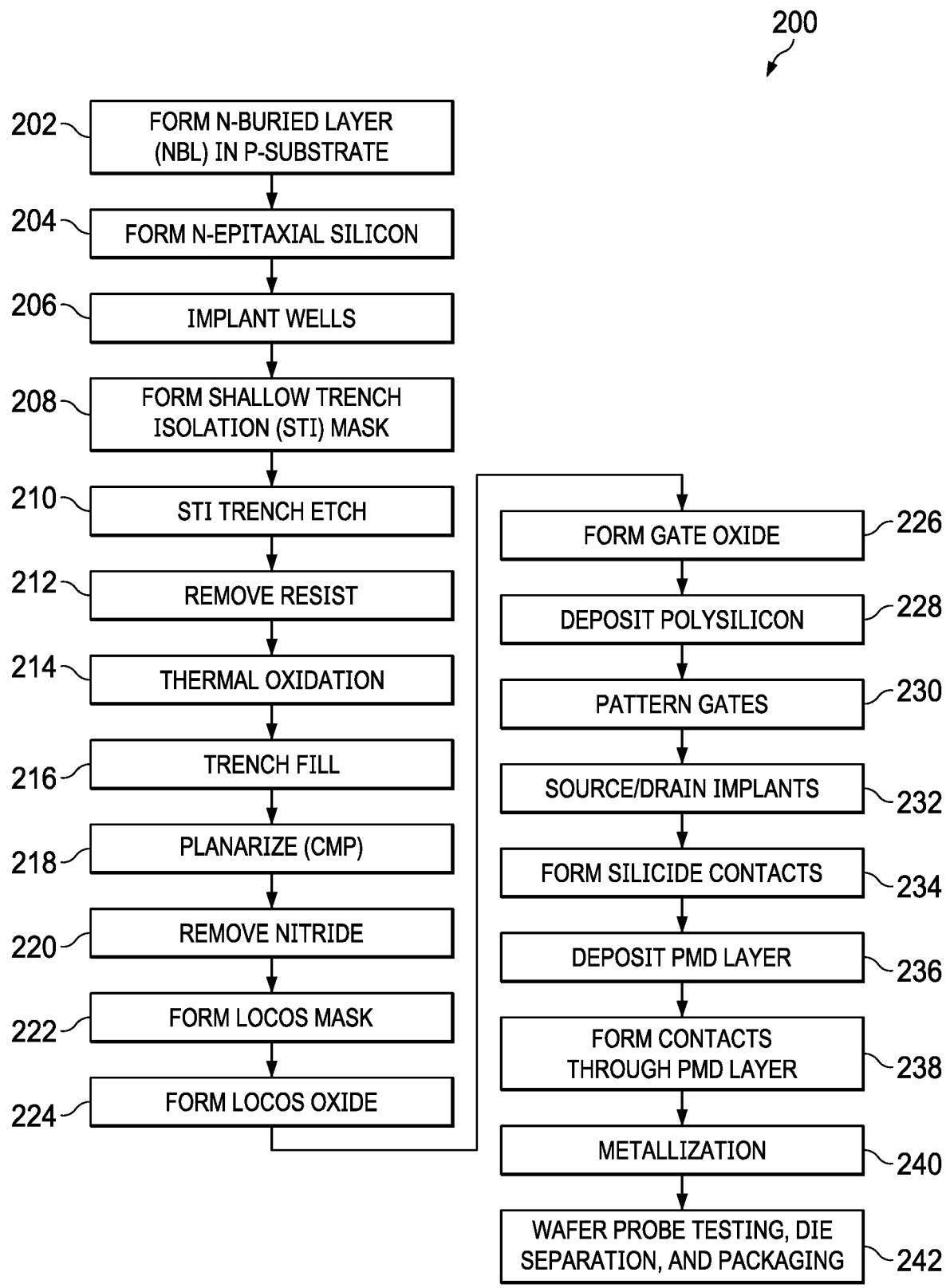
FIG. 2 is a flow diagram of a method of fabricating an electronic device.

The method 200 begins in FIG. 2 with a starting wafer, such as a silicon wafer 102 or a silicon on insulator wafer that includes majority carrier dopants of a first conductivity type (e.g., P in the illustrated example). The method 200 includes forming a buried layer at 202. FIG. 3 shows one example, in which an implantation process 300 is performed using an implant mask 301. The implantation process 300 implants dopants of the second conductivity type (e.g., N in the illustrated example) into an exposed portion of the top side of the semiconductor substrate 102 to form the buried layer 104 in a portion of the semiconductor substrate 102. The implant mask 301 is then removed. In another implementation, a blanket implantation is performed at 202 without an implant mask.

At 204 in FIG. 2, the method 200 also includes forming a semiconductor surface layer on the semiconductor substrate. FIG. 4 shows one example, in which an epitaxial growth process 400 is performed with in-situ N-type dopants that grows the N-doped epitaxial silicon semiconductor surface layer 106 on the top side of the semiconductor substrate 102.

Figure 5:
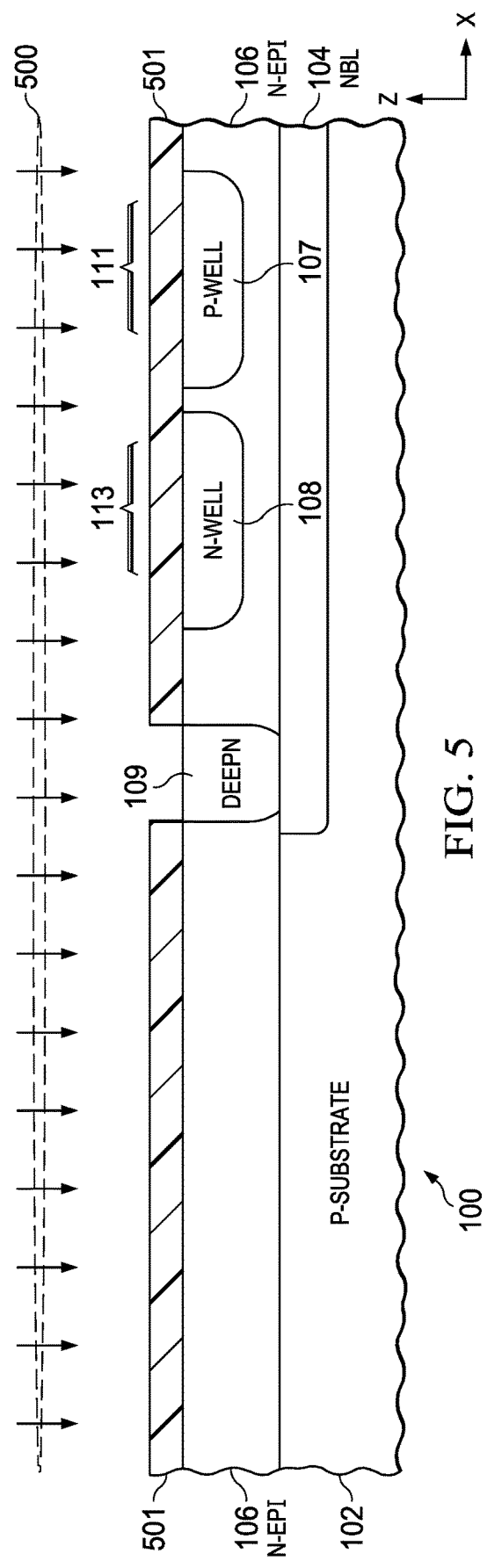

At 206 in FIG. 2, the method 200 also includes forming a deep doped region that includes majority carrier dopants of the second conductivity type. FIG. 5 shows one example, in which an implantation process 500 is performed using an implant mask 501. The implantation process 500 implants dopants of the second conductivity type (e.g., N in the illustrated example) into an exposed portion of the top side of the semiconductor surface layer 106 to form the deep doped region 109 that extends from the top side of the semiconductor surface layer 106 to the buried layer 104. The implant mask 501 is then removed.

The method 200 in one example also includes one or more well implants at 206, for example, implanting boron or other p-type dopants to form the p-doped well or region 107 using a first implant mask (not shown), and implanting phosphorus or other n-type dopants with a second implant mask to form the n-doped well or region 108 shown in FIG. 5. The p-doped region 107 is formed on one example by ion implanting a first set of p-type dopants, such as boron, for example in the form of $BF_2$, and/or gallium and/or indium, for example, at doses from 1E11 to 1E14 atoms/$cm^2$, into a region defined for the n-channel FET 111 while an implant mask (not shown) covers the regions defined for the p-channel FET 113. In one example, the p-doped region 107 extends from the top side or surface of the semiconductor surface layer 106 to a depth of 50 nm to 500 nm. The ion implantation process to form the p-doped region 107 in one example further includes implanting additional p-type dopants at shallower depths, for example, to improve the n-channel transistor performance, such as threshold adjustment, leakage current reduction and suppression of parasitic bipolar operation, etc.

In one example, the n-doped region 108 is formed at 206 by ion implanting a first set of n-type dopants, such as phosphorus, arsenic and/or antimony, for example at doses from 1E11 to 1E14 atoms/cm$^2$, into a region defined for the p-channel transistor 113 using an implant mask (not shown) that exposes the region 108 and covers the other regions of the semiconductor surface layer 106. The n-doped region 108 in one example extends from the top side or surface of the semiconductor surface layer 106 to a depth of 50 nm to 500 nm. The ion implantation process to form the n-doped region 108 in one example also includes implanting n-type dopants at shallower depths for purposes of improving transistor performance, such as threshold adjustment, leakage current reduction and suppression of parasitic bipolar operation.

Figure 6:
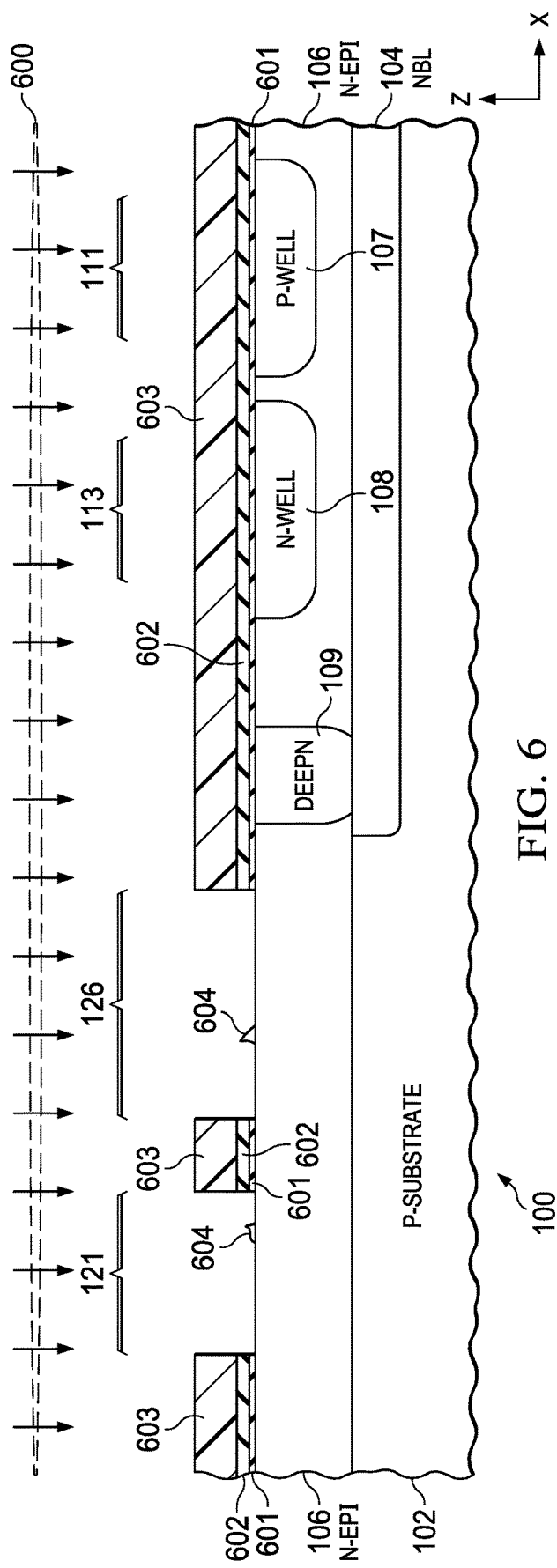

At 208-220 in FIG. 2, the method 200 also includes STI processing to form the shallow trench isolation structures 110. The STI processing includes forming an STI mask at 208. FIG. 6 shows one example, in which a mask structure is formed by a mask formation process 600 that includes depositing or growing a pad oxide layer 601 on a top side of the semiconductor surface layer 106, forming a nitride layer 602 (e.g., SiN) on the oxide layer 601, depositing a resist layer 603 on the nitride layer 602, and patterning the resist and the mask layers 602 and 601 to expose or open portions above the prospective STI trench areas of the resistor 121 and the capacitor 126 as shown in FIG. 6. As shown in FIG. 6, in practice, the STI trench etch mask formation processing steps may leave defects such as nitrogen particles 604 on the top side of the exposed portions above the prospective STI trench areas of the resistor 121 and the capacitor 126. The defects 604 inhibit the subsequent trench etching, and act like small etch masks.

Figure 7:
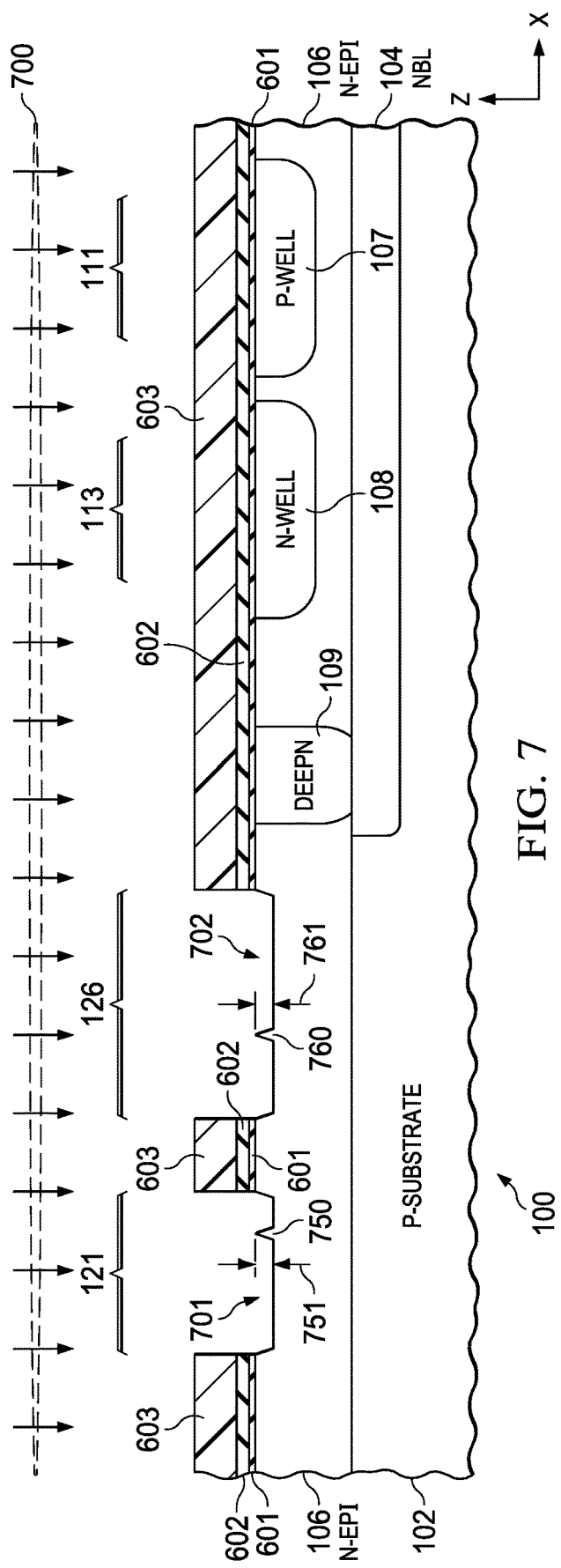

The method 200 includes STI trench etching at 210 using the patterned STI trench etch mask 601, 602, 603 formed at 208. FIG. 7 shows one example, in which a reactive ion etch (RIE) or other dry etch process 700 is performed that forms STI trenches 701 and 702 that extend into the top side of the exposed portions of the semiconductor surface layer 106. In one example, the STI trenches 701 and 702 have a trench depth along the third direction Z of approximately 0.34 um to 0.40 um, for example, within a manufacturing tolerance of the STI trench etch process 700. As shown in FIG. 7, moreover, the defects 604 present in FIG. 7 lead to imperfect etching during the process 700, and conical silicon structures 750 and 760 remain that extend upward along the third direction Z from the bottom sides of the respective etched trenches 701 and 702. In the illustrated example, the conical silicon structure 750 has a height 751 and the conical silicon structure 760 has a height 761. In one example, the heights 751 and 761 are the same. In another example, the heights 751 and 761 are different. In another example, the structures 750 and/or 760 have different shapes. In one example, the heights 751 and 761 are approximately equal to the depths of the respective STI trenches 701 and 702 (e.g., approximately 0.34 um to 0.40 um).

Figure 8:
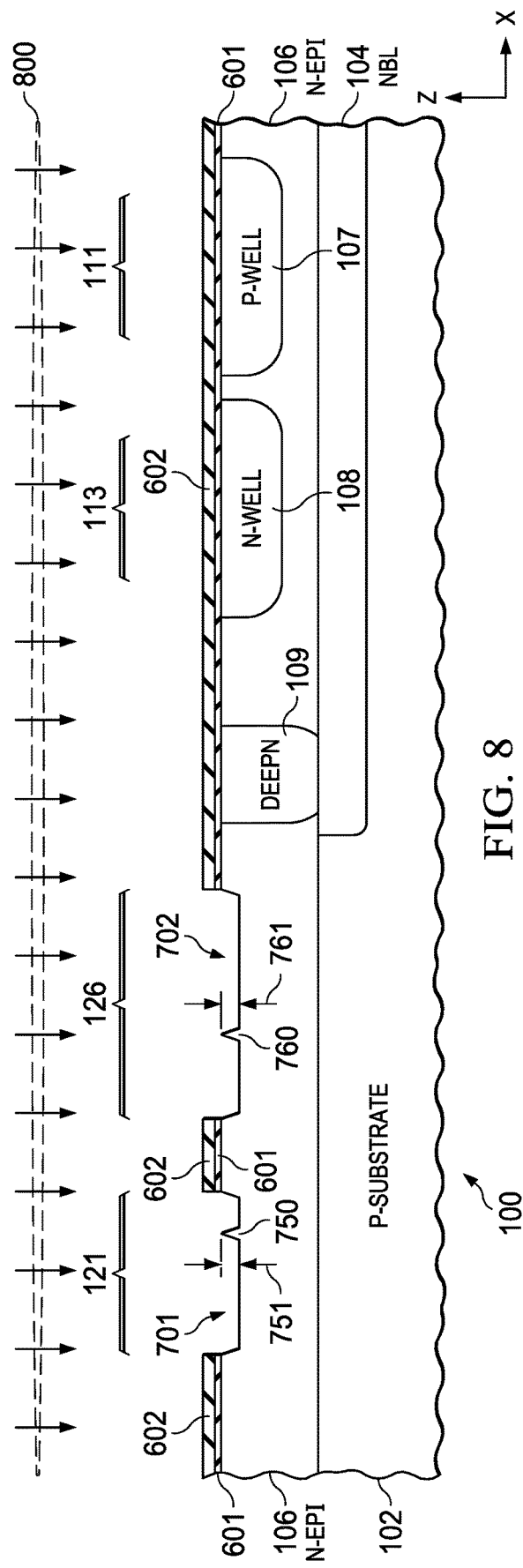
Figure 9:
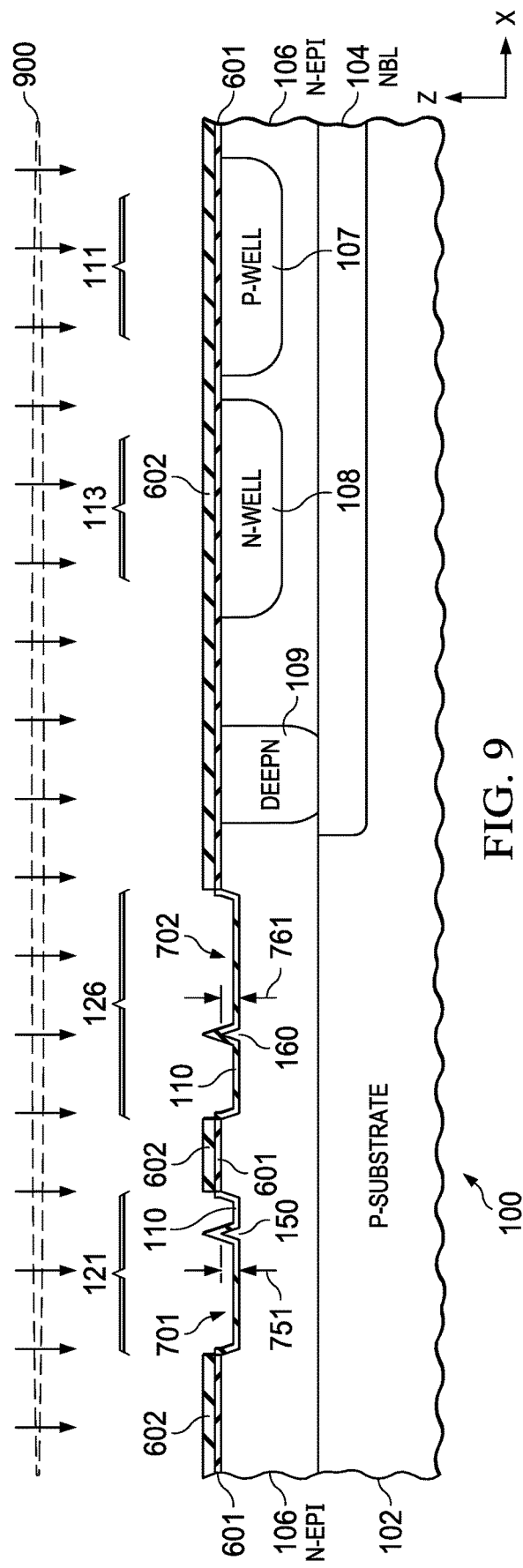

The method also includes removing the resist 603 at 212 in FIG. 2. FIG. 8 shows one example, in which a photoresist removal process 800 is performed that removes the resist 603 and leaves the nitride mask layer 602 in the oxide 601. The method 200 also includes a thermal oxidation at 214 to form a thin oxide along the bottom and sidewalls of the trenches 701 and 702 including the tops and sidewalls of the conical silicon structures 750 and 760. FIG. 9 shows one example, in which a thermal process 900 is performed that forms oxide 110 along the exposed surfaces of the trenches 701 and 702 and the conical silicon structures, with the conical structures forming the silicon-filled indents 150 and 160 in FIG. 9.

Figure 10:
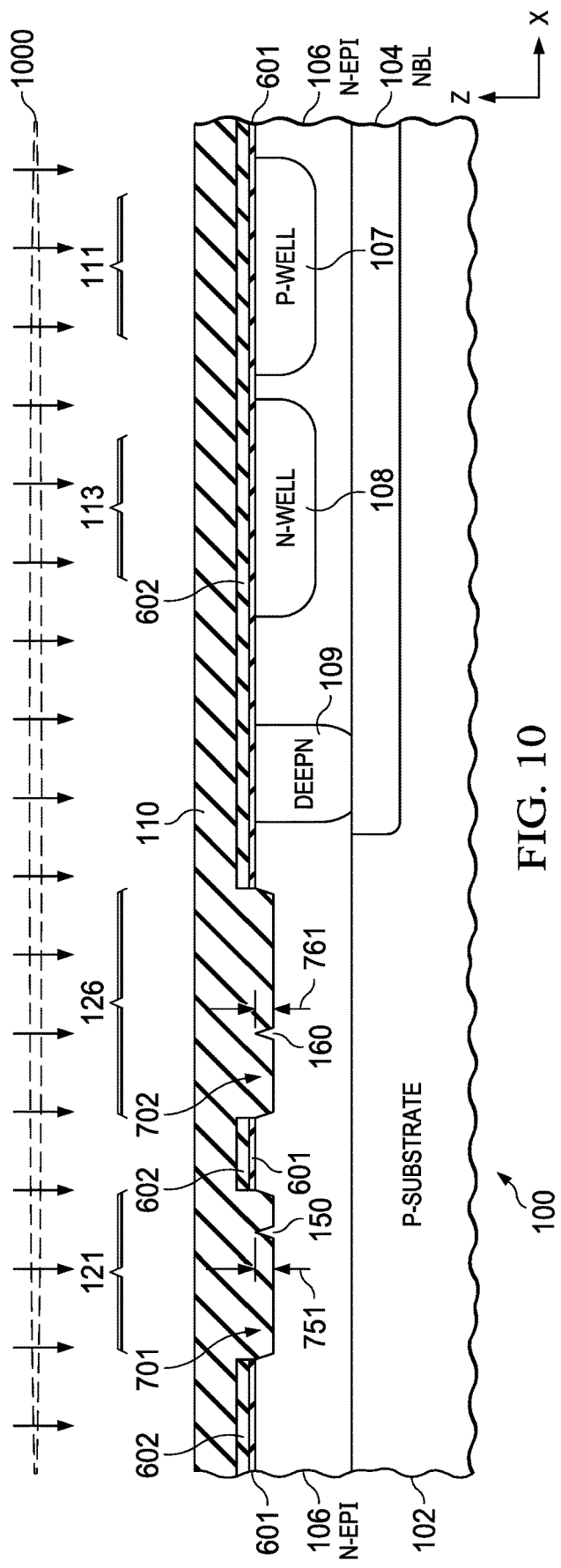
Figure 11:
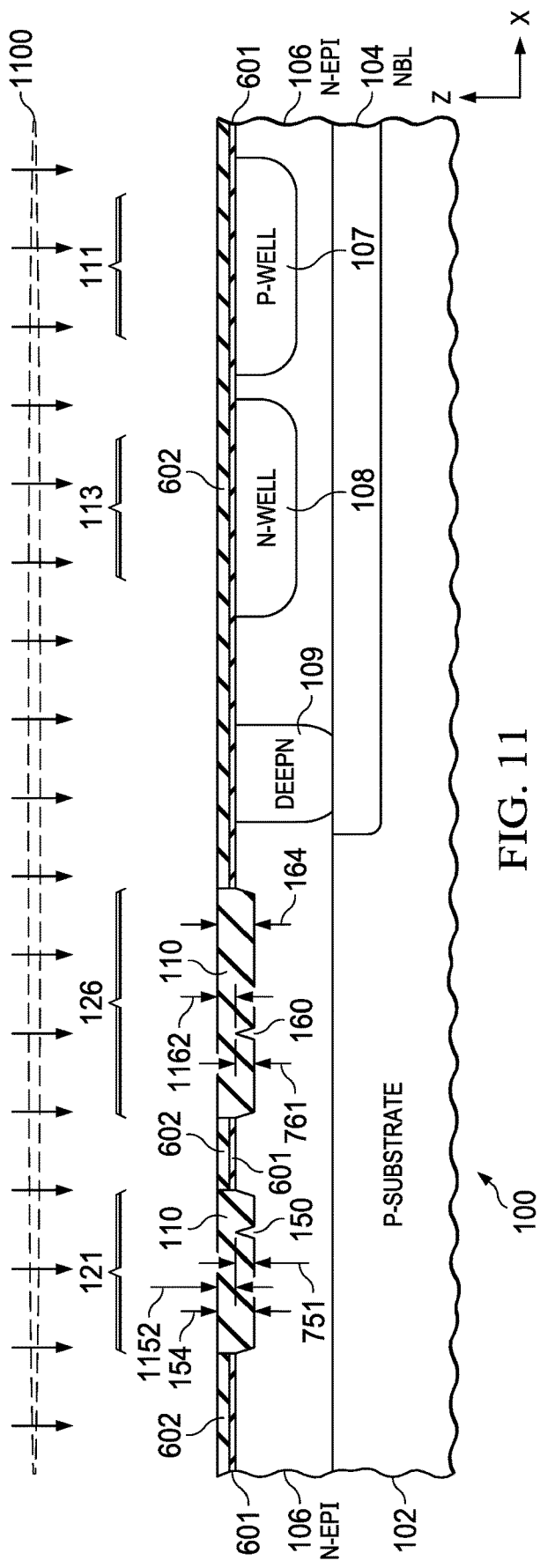

The STI trenches 701 and 702 are filled at 216 in FIG. 2. FIG. 10 shows one example, in which a deposition process 1000 is performed that deposits or otherwise forms the STI dielectric material (e.g., SiO$_2$) 110 in the trenches 701 and 702. In one example, the process 1000 is or includes chemical vapor deposition (CVD) processing to deposit SiO$_2$ to fill the trenches 701 and 702 and to continue forming the oxide 110 above the tops of the trenches as shown in FIG. 10. The structure is then planarized at 218. FIG. 11 shows one example, in which a chemical mechanical polishing (CMP) process 1100 is performed that planarizes the top side of the processed wafer structure of the device 100. The CMP process 1100 in one example stops on the nitride mask layer 602 as shown in FIG. 11. This sets the thicknesses 154 and 164 of the STI structures 110 (e.g., 350 nm or more, such as approximately 380 nm). In addition, the termination of the planarization process 1100 sets the initial gap distances 1152 and 1162 between the top sides of the STI structures 110 and the tops of the silicon-filled conical indents 150 and 160, as shown in FIG. 11.

Figure 12:
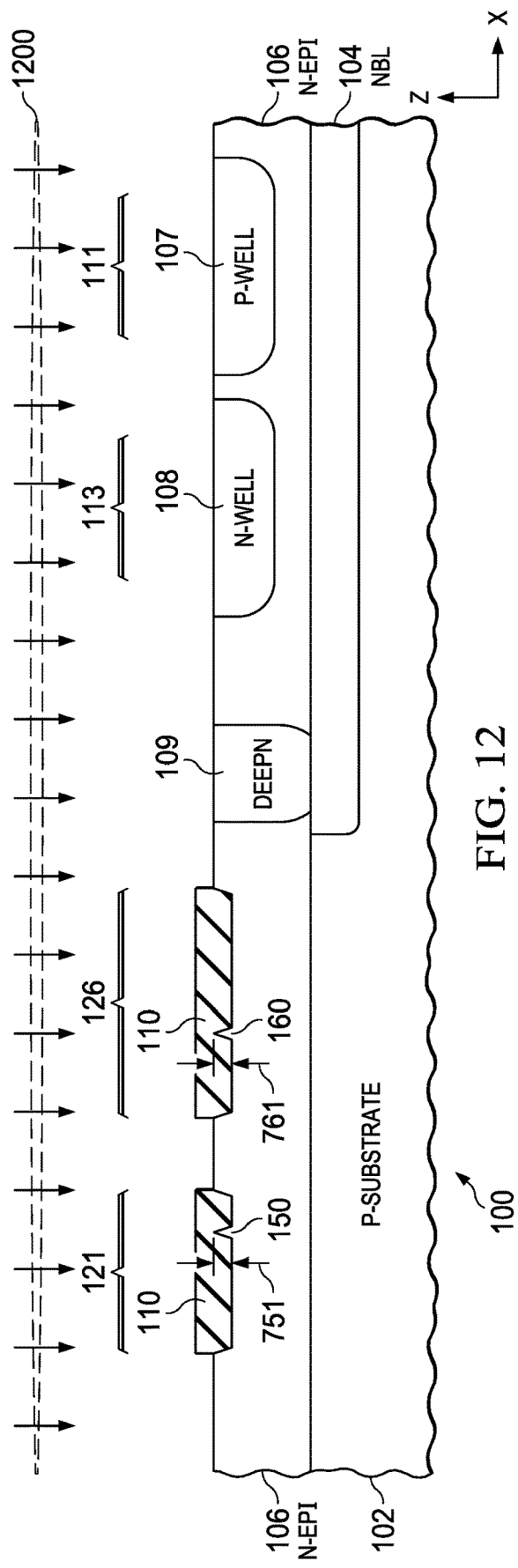

The protective nitride 602 and the oxide 601 are then removed at 220 in FIG. 2. FIG. 12 shows one example, in which a nitride strip process 1200 is performed that removes the remaining nitride and oxide. As shown in FIG. 12, the indents 150 and 160 have respective heights 751 and 761 equal to or close to the corresponding STI trench depths. Direct formation of doped polysilicon on the top sides of the STI structures 110 would lead to this oxide between the polysilicon and the tops of the silicon-filled indents 150 and 160. The example method 200 uses oxidation to reduce the indent heights and increase the gap distances between the indent tops and the top sides of the respective STI structures 110.

Figure 13:
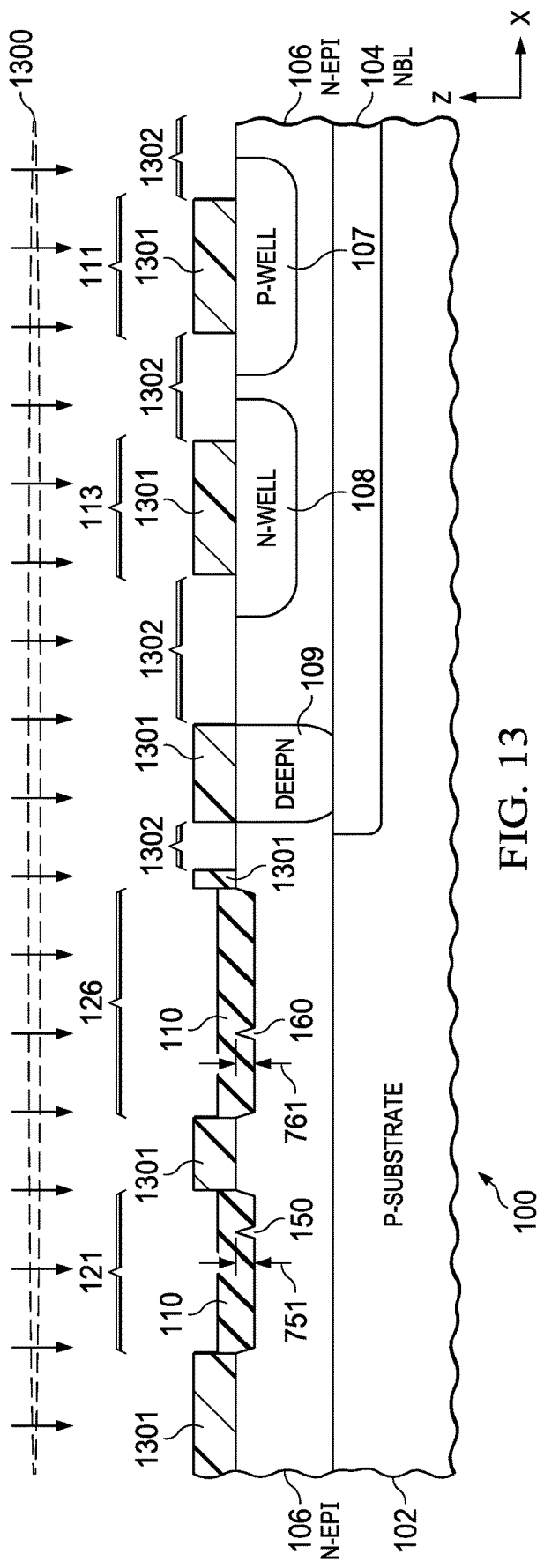

The example method 200 includes oxidizing the STI structures 110 concurrently with formation of the LOCOS structures 117, without adding any processing steps or cost, by modifying a LOCOS mask used in the device fabrication process 200. The method 200 includes forming a LOCOS mask at 222. FIG. 13 shows one example, in which a process 1300 is performed to deposit and pattern a mask 1301 on the semiconductor surface layer 106. The mask 1301 exposes a surface of a dielectric material of the STI structures 110. In the illustrated example, moreover, the mask 1301 exposes prospective LOCOS portions 1302 of the surface of the semiconductor surface layer 106 as shown in FIG. 13. In another example, separate oxidation processes and respective masks are used for separately oxidizing the LOCOS portions 1302 and the STI structures 110.

Figure 14:
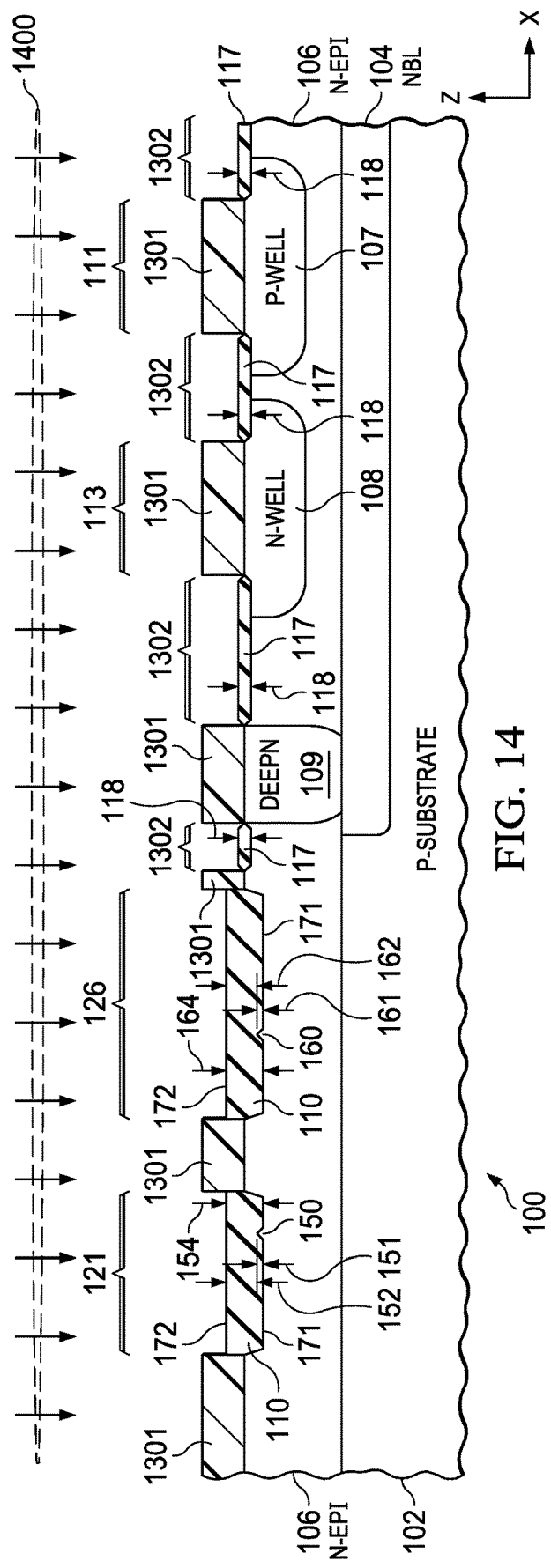

At 224, the LOCOS oxide is formed. FIG. 14 shows one example, in which a thermal oxidation process 1400 is performed that oxidizes the second (e.g., top) side 172 of the STI structures 110, and concurrently grows the oxide material 117 on the exposed LOCOS portions 1302 of the upper surface of the semiconductor surface layer 106. In one example, the oxidation process 1400 grows the LOCOS oxide material 117 to a thickness 118 of 50 nm or more. The oxidation process 1400 in one example oxidizes silicon in the tops of the indents 150 and 160 in the dielectric material of the STI structures 110. In one example, the oxidation process 1400 increases the gap distances 152 and 162 by up to approximately half the LOCOS structure thickness 118. The LOCOS process in one example grows approximately 100 nm of oxide (e.g., SiO$_2$) in forming the LOCOS structures 117, which consumes approximately 50 nm of silicon from the silicon in the indents 150 and 160. This increases the gap distances 152 and 162 compared with the distances 751 and 751 above and reduces the heights 151 and 161 of the respective indents 150 and 160. This increases the oxide thickness between tops of the indents 150 and 160 and the subsequently formed doped polysilicon structures 116 of the resistor 121 and the capacitor 126. This indent height reduction means that the electric field across the oxide is lower in operation, and oxide breakdown is less likely.

Figure 15:
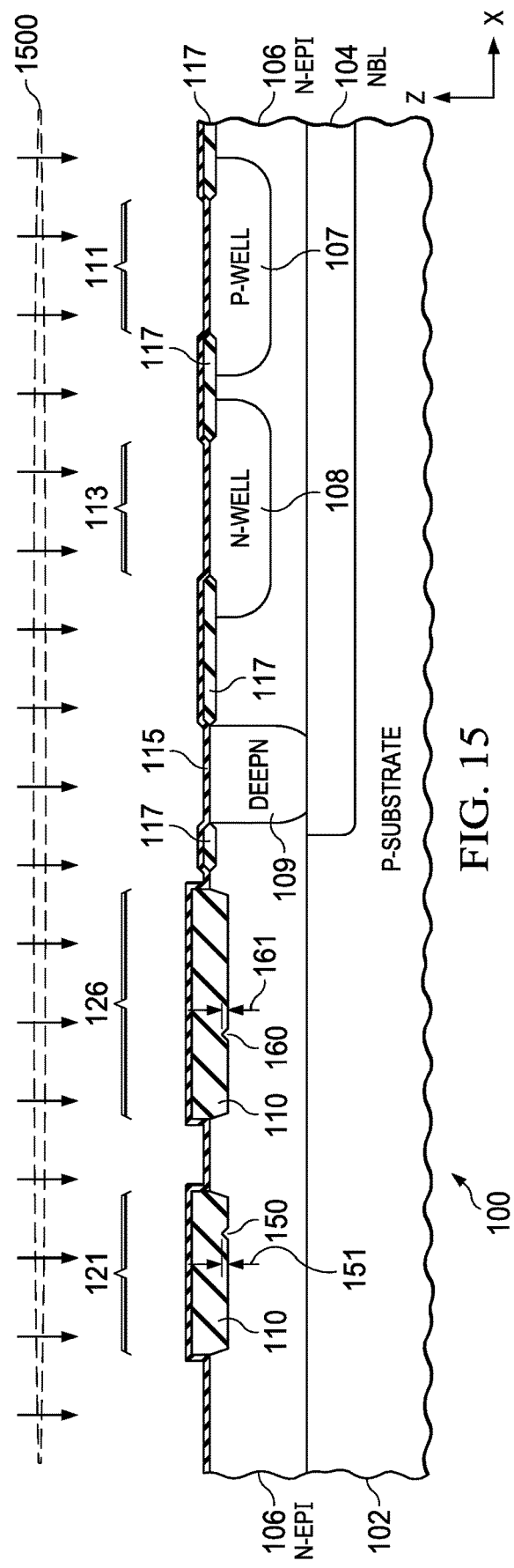

The method 200 proceeds to transistor fabrication after the LOCOS oxidation. At 226, a gate dielectric or gate oxide layer is formed. FIG. 15 shows one example, in which a blanket deposition process 1500 is performed that deposits the gate dielectric (e.g., gate oxide) layer 115 on the prospective transistor channel regions as well as on the STI isolation structures 110. In one example, the gate dielectric layer 115 is or includes silicon dioxide, nitrogen doped silicon dioxide, silicon oxy-nitride, hafnium oxide, layers of silicon dioxide and silicon nitride, or other insulating material, with a thickness of 1 to 3 nm on the top side or surface of the channel regions, as well as on the STI isolation structures 110.

Figure 16:
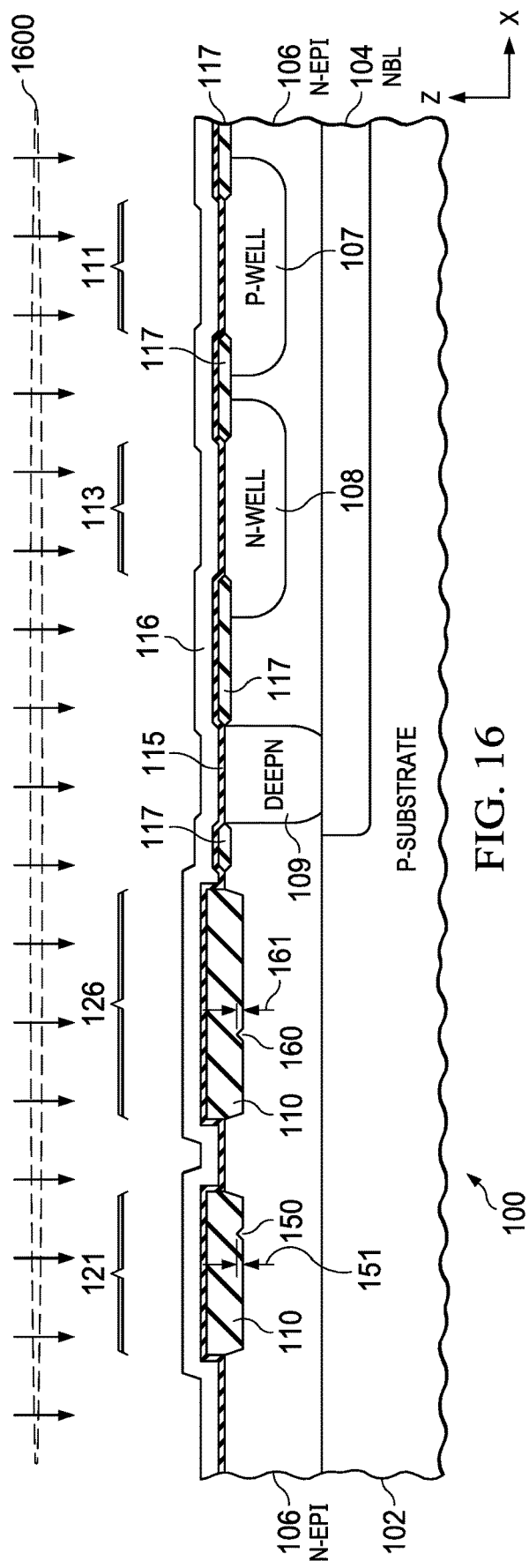

At 228 in FIG. 2, polysilicon is deposited. FIG. 16 shows one example, in which a blanket deposition process 1600 is performed that deposits a polysilicon layer 116 on the top surface of the gate dielectric layer 115, for example, to a thickness of 50 to 150 nm.

Figure 17:
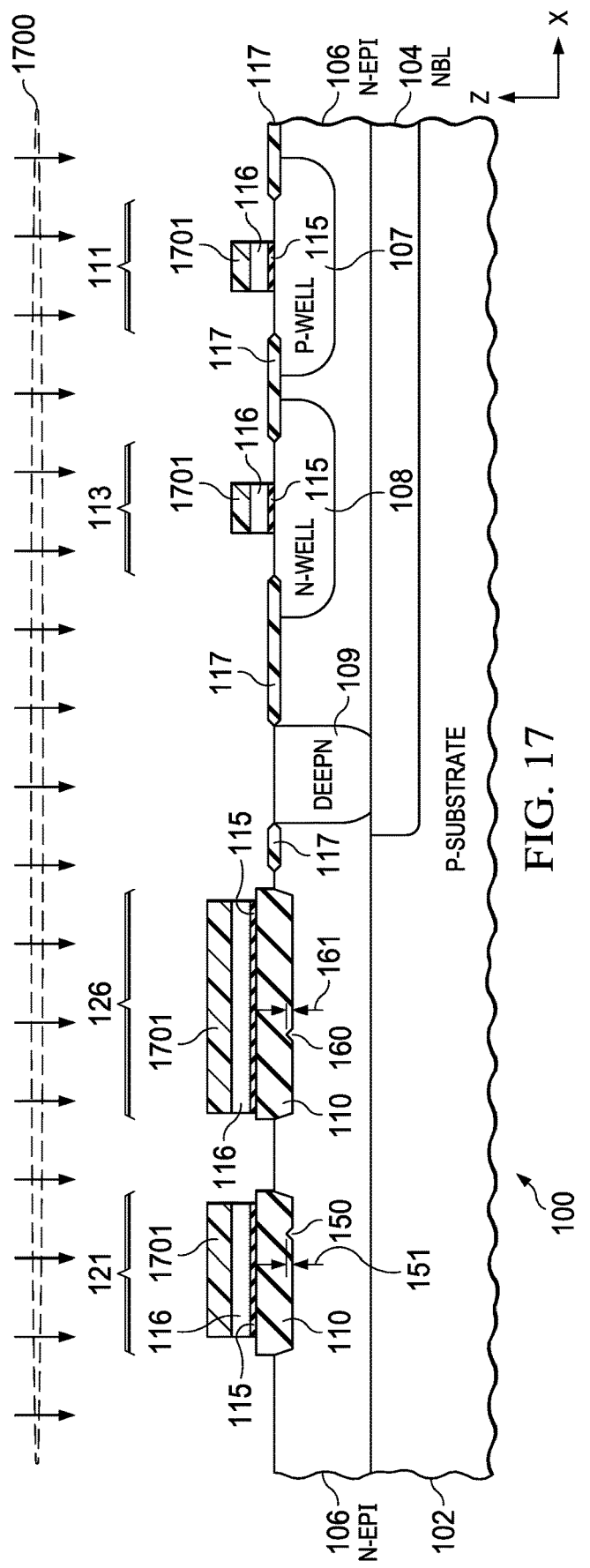

The polysilicon layer 116 is then patterned at 230. FIG. 17 shows one example, in which an etch process 1700 is performed using an etch mask 1701 to define the gate regions of the transistors 111 and 113 to leave the respective patterned gate oxide and electrode structures 115 and 116. The gate etch process 1700 and the etch mask 1701 concurrently define the polysilicon structures 116 on the second sides 172 of the dielectric material of the respective STI structures 110 of the resistor 121 and of the capacitor 126.

Figure 18:
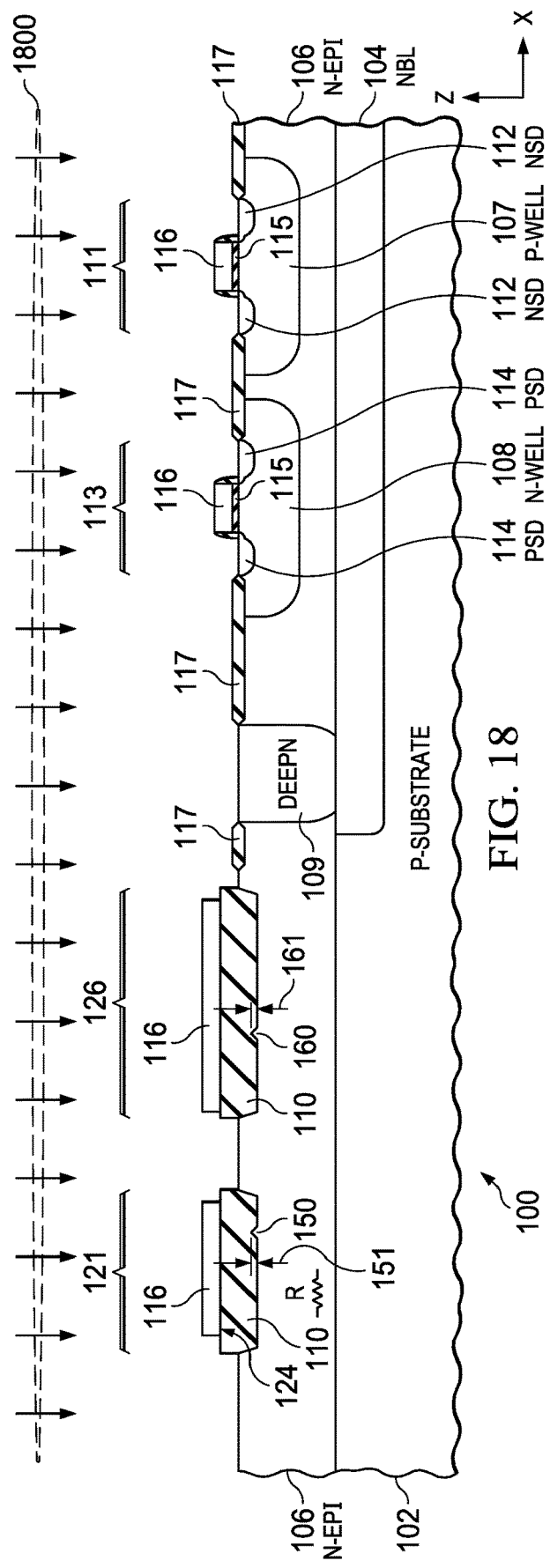

Referring also to FIG. 18, the method 200 further includes source/drain implants and formation of offset spacers, such as silicon dioxide and/or silicon nitride (e.g., 1 to 10 nm thick, not numerically designated in the figures) on lateral surfaces of the patterned gate structures 115, 116, for example, by oxidizing exposed surfaces of the gate or gates 116 and/or depositing a layer of silicon dioxide or silicon nitride followed by anisotropic etching (not shown). The implants and sidewall spacer formation can be in any suitable order, for example, including lightly doped drain (LDD) implants and shallow implantations before formation of sidewall spacers, followed by further (e.g., deeper) source/drain implants, separately for the transistors 111 and 113.

In one example, p-type dopants are implanted at 232 in FIG. 2 into the top side of the semiconductor surface layer 106 in the n-doped well 108 to form all or a portion of the source/drain implanted portions 114. FIG. 18 shows one example, in which source/drain implantation processes 1800 are performed using associated implant masks (not shown), including a first masked implant that implants p-type dopants (e.g., boron) into the source/drain implanted portions 114, and p-type source/drain implant annealing (not shown) is performed to anneal the p-type dopants of the source/drain implanted portions 114.

In addition, an n-type source/drain implantation is performed to form the source/drain implanted portions 112 using an associated implant mask (not shown) to implant n-type dopants (e.g., phosphorus) into the source/drain implanted portions 112 of the semiconductor surface layer 106 along the top side in the p-doped well 107, followed by another annealing process. In addition, sidewall spacers are formed along the sidewalls of the gate structure 115, 116 of the n-channel transistor 111, for example, by oxidizing exposed surfaces of the gate 116, and/or depositing a layer of silicon dioxide or silicon nitride followed by anisotropic etching (not shown). One or both of the source drain implants at 232 and/or in-situ doping during polysilicon deposition at 228 can be used to implant impurities into the patterned polysilicon structures to provide doped-polysilicon structures 116 of the transistor gates, the resistor 121 and the capacitor 126.

Figure 19:
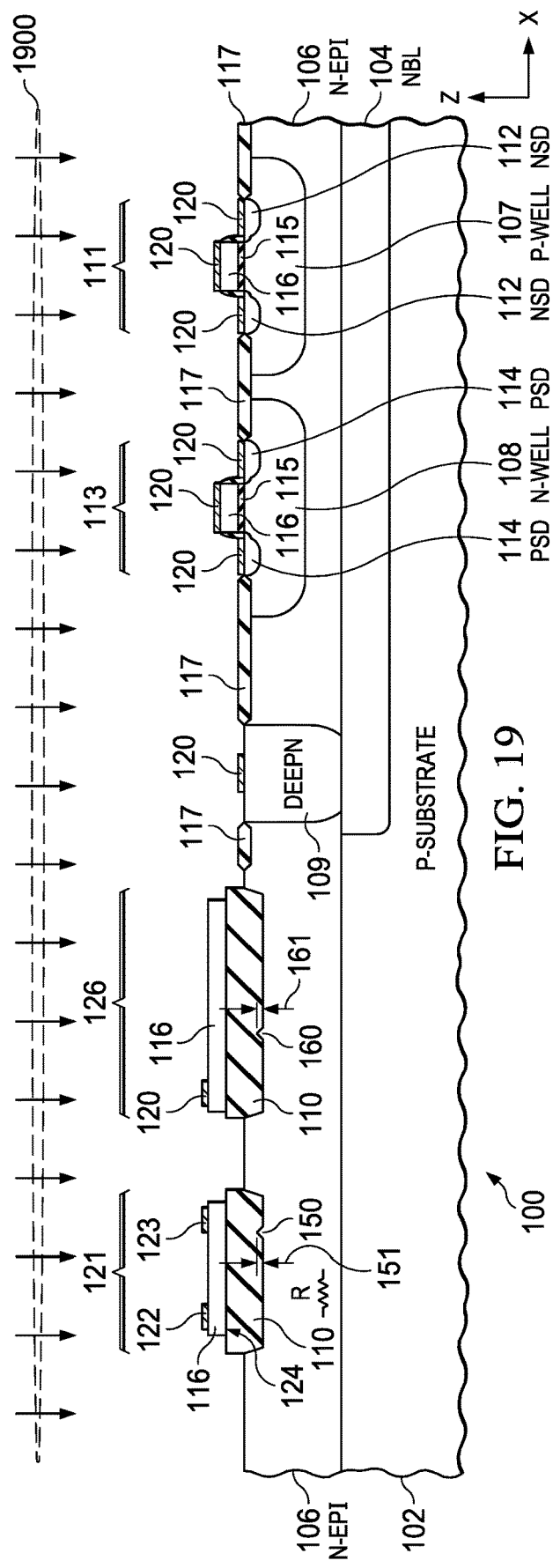

Silicide contacts are formed at 234. FIG. 19 shows one example, in which a silicidation process 1900 is performed using a silicide block mask and a deposited silicidable metal material (not shown) to selectively form conductive metal silicide structures 120 for electrical connection to the gates, source/drains of the transistors 111 and 113, and for connection to the doped polysilicon lower capacitor plate of the capacitor 126. The process 1900 also forms a conductive metal silicide first contact 122 proximate a first end of the doped polysilicon structure 116 of the resistor 121 and a conductive metal silicide second contact 122 proximate a second end of the doped polysilicon structure 116 of the resistor 121 on the side 172 of the dielectric material of the STI structure 110.

Figure 20:
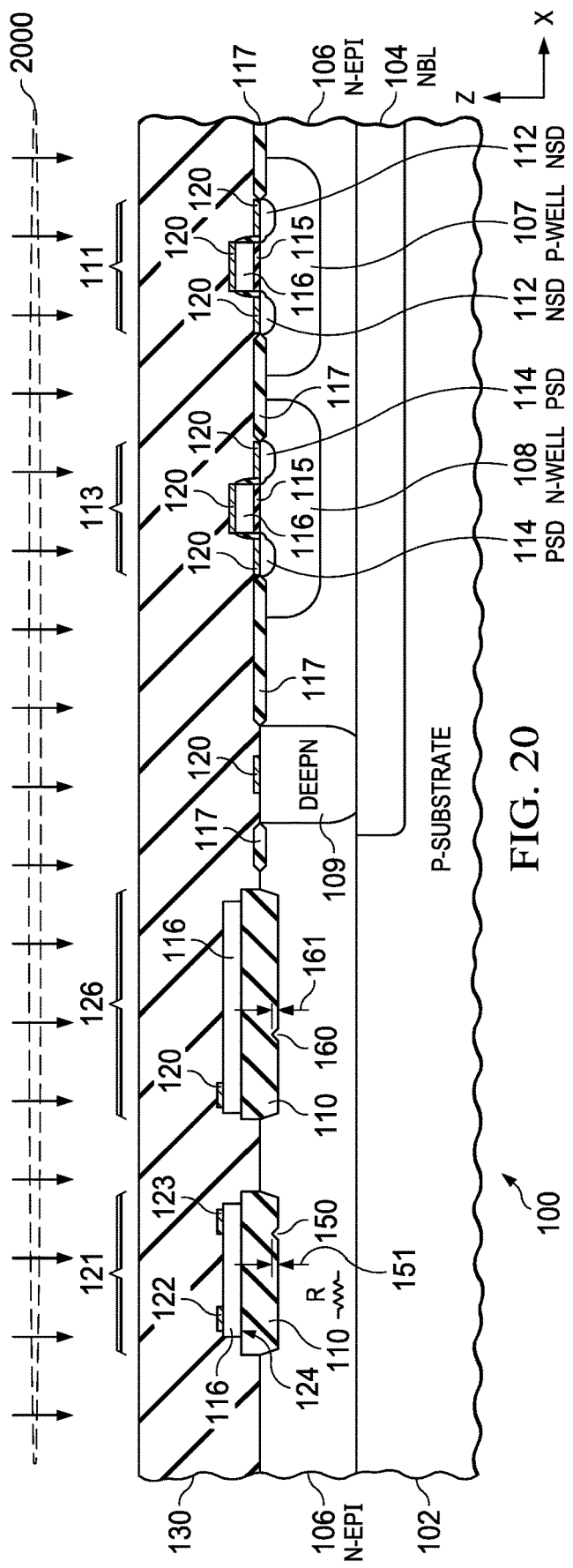

At 236 in FIG. 2, a dielectric (e.g., PMD) layer is formed. FIG. 20 shows one example, in which a deposition process 2000 is performed that forms the PMD dielectric layer 130 on the semiconductor surface layer 106, the isolation structures 110, and the metal silicide structures 120, 122, and 123. In one example, the dielectric layer 130 is or includes a dielectric layer stack including a silicon nitride or silicon dioxide PMD liner (not shown) having a thickness of 10 to 100 nm formed by plasma enhanced chemical vapor deposition (PECVD), as well as a layer of silicon dioxide, phosphosilicate glass (PSG) or borophosphosilicate glass (BPSG) to a thickness of 100 to 1000 nm formed by PECVD and leveled or planarized by a CMP process, and an optional PMD cap layer (not shown) having a thickness of 10 to 100 nm that is or includes a hard material such as silicon nitride, silicon carbide nitride or silicon carbide.

Figure 21:
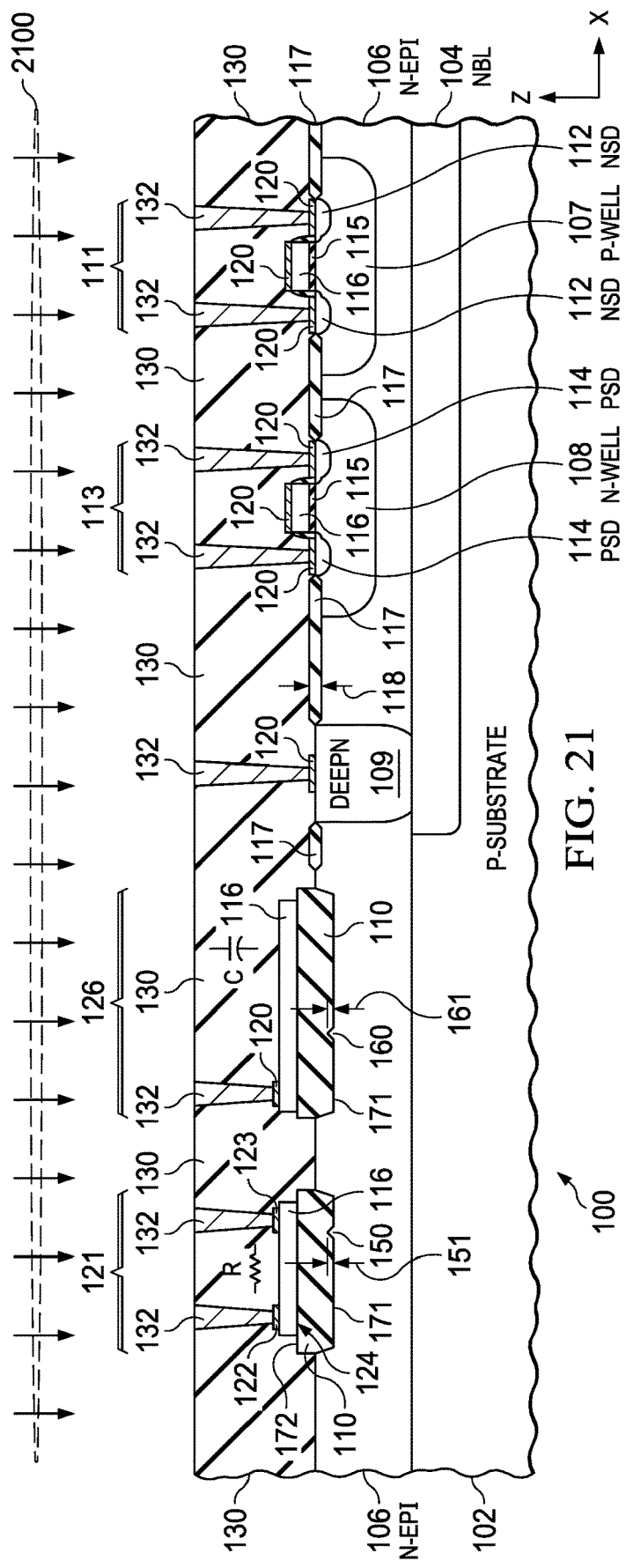

At 238, conductive contacts (e.g., tungsten) are formed through the dielectric layer 130, FIG. 21 shows one example, in which a process 2100 is performed that forms the conductive contacts 132 through respective locations in the PMD dielectric layer 130 to contact the metal silicide structures 120 of the passive circuit components 121 and 126, and to contact the source/drains 112 and 114 and the gate electrodes 116 of the transistors 111 and 113. In one example, the process 2100 includes etching contact holes in the PMD dielectric layer 130 to expose the metal silicide structures 120, and filling the contact holes with contact metal, such as tungsten, such that electrical connections between the contacts 132 and the metal silicide structures 120 are formed.

Figure 22:
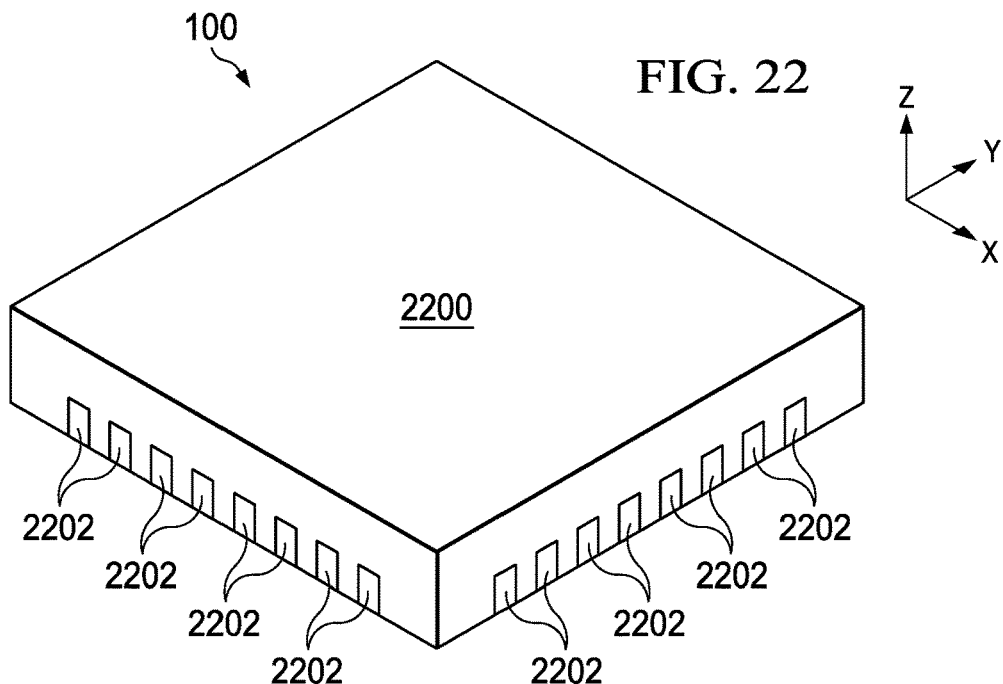
FIG. 22 is a perspective view of the packaged electronic device of FIGS. 1 and 3-21.

At 240, one or more ILD dielectric layers and associated metal routing trace features and vias are formed to create a single or multilayer metallization structure (e.g., the ILD layer 140, conductive trace features 142 and vias 144 in FIG. 1). The metallization structure couples the metal silicide structures 120 and the terminals of the passive circuit components to one or more respective circuits and provides electrical coupling of the transistor source, drain, and gate terminals. In addition, the metallization structure includes formation of a top capacitor plate as one of the conductive trace features 142 above the PMD layer 130 to form the capacitor 126. The processed wafer undergoes wafer probe testing and individual semiconductor dies are separated or singulated from the wafer and packaged at 242 in FIG. 2. FIG. 22 shows an example of a resulting packaged electronic device 100 with a molded package structure 2200 and conductive leads 2202.

Figure 23:
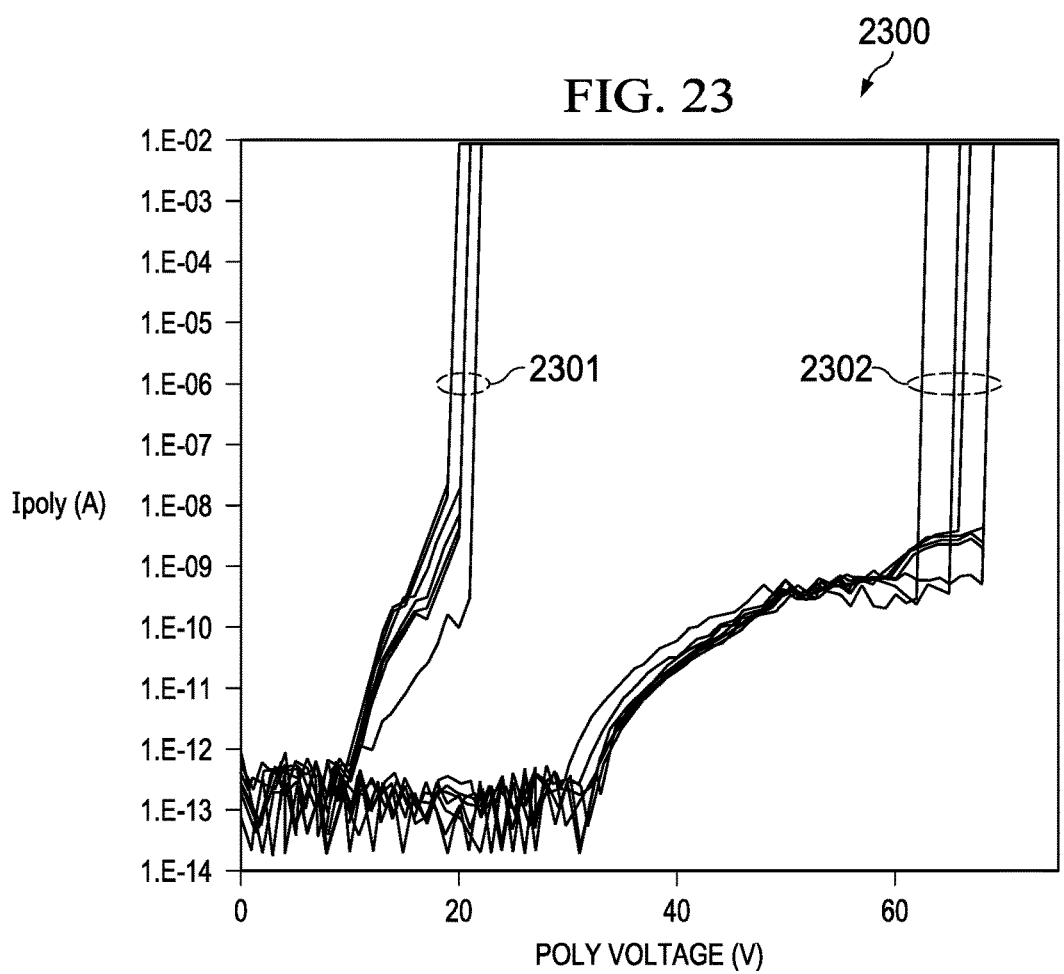
FIG. 23 shows a breakdown voltage performance graph.

FIG. 23 shows a graph 2300 including a first set of breakdown voltage curves 2301 and a second set of curves 2302 having significantly higher breakdown voltage levels. In this example, the curves 2301 represent devices with nitride defects that create cone indents in the STI structures, but the STI structures are not oxidized and the thin oxide remaining between the tops of the cone indents and the overlying polysilicon is susceptible to voltage breakdown at relative low voltages (e.g., approximately 20 V poly voltage in FIG. 23). The above oxidation processing through exposure of the STI structures to the LOCOS oxidation process to increase the gap distances 152 and 162 is represented by the breakdown voltage results shown in the curves 2302 in FIG. 23 (e.g., higher breakdown voltage above 60 V).

Figure 24:
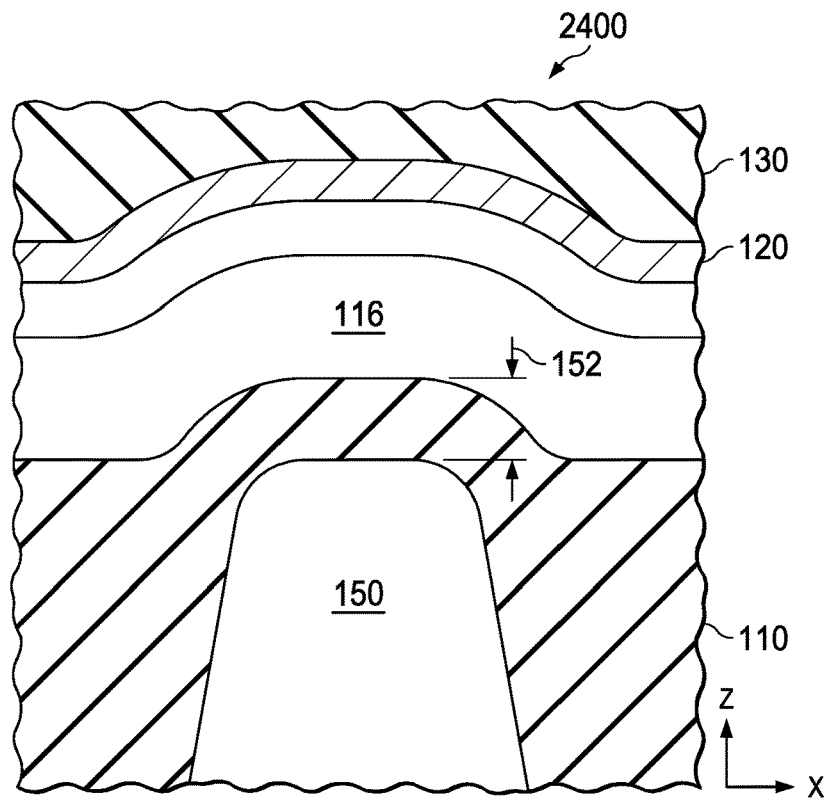
FIG. 24 is a partial sectional side view of an example cone defect reduced by exposing the STI structure to an oxidation process.
Figure 25:
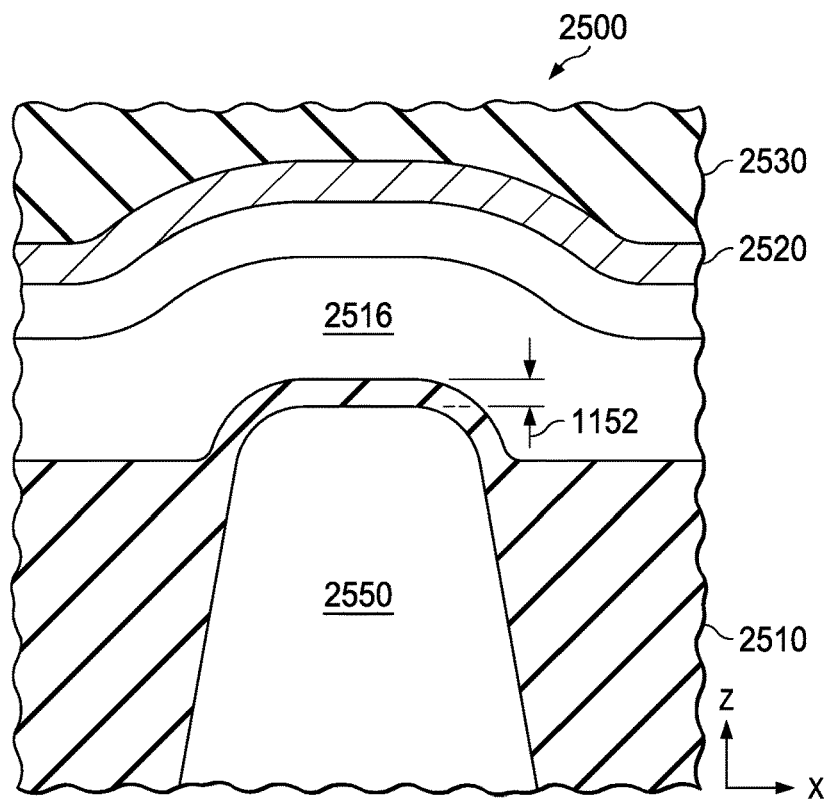
FIG. 25 is a partial sectional side view of another cone defect in an STI structure that is not reduced by oxidation.

Referring also to FIGS. 24 and 25, FIG. 24 is a partial sectional side view of an example cone defect 150 reduced by exposing the STI structure 110 to the LOCOS oxidation process. In this example, the cone height is reduced and the gap distance 152 is increased as described above in connection with FIGS. 13 and 14. FIG. 25 is a partial sectional side view of another cone defect 2550 in an STI structure 2510 under a polysilicon structure 2520 covered by a PMD dielectric layer 2530. In this example, the cone defect or indent 2550 is not reduced by oxidation, and the corresponding gap distance 1152 is much smaller than the gap distance 152 shown in the example of FIG. 24.

The described examples open the nitride LOCOS oxidation mask over the STI regions to allow the oxidation in the STI regions 110 and the resulting oxidation of the cone tips increases the remaining oxide thickness (e.g., gap distances 152 and 162) between the cone tips and overlying polysilicon structures 120. The reduced electric fields at cone defect locations results in fewer product failures. This provides a solution even in situations where it is difficult or impossible to eliminate cone defects from the STI trench etch processing. Certain implementations help reduce the likelihood of cone defects with low cost and without adding additional masks or processing steps.

Modifications are possible in the described examples, and other implementations are possible, within the scope of the claims.

What is claimed is:

1. An electronic device, comprising:
a semiconductor surface layer extending in a plane of orthogonal first and second directions;
a first isolation structure having a dielectric material in a trench of the semiconductor surface layer, the dielectric material having a first side, a second side, and an indent, the first side on a surface of the trench, the first side spaced apart from the second side along a third direction, the third direction orthogonal to the first and second directions, the indent extending into the first side along the third direction, the indent filled with a semiconductor material of the semiconductor surface layer, and an end of the indent spaced apart from the second side along the third direction by a gap distance, the gap distance being 20 nm or more, and the gap distance less than a first thickness of the dielectric material along the third direction;
a second isolation structure spaced apart from the first isolation structure, the second isolation structure having a thermally grown dielectric material including the semiconductor material, wherein the thermally grown dielectric material has a second thickness along the third direction that is less than the first thickness; and
a passive circuit component having a doped polysilicon structure on the second side of the dielectric material.

2. The electronic device of claim 1, wherein the gap distance is 50 nm or more.

3. The electronic device of claim 2, wherein the dielectric material has a thickness along the third direction of 350 nm or more.

4. The electronic device of claim 1, wherein the second thickness of the second isolation structure is greater than the gap distance.

5. The electronic device of claim 1, wherein the passive circuit component is a resistor.

6. The electronic device of claim 1, wherein the passive circuit component is a capacitor, and the doped polysilicon structure is a first capacitor plate of the capacitor.

7. The electronic device of claim 1, wherein the dielectric material has a thickness along the third direction of 350 nm or more.

8. The electronic device of claim 5, wherein the resistor includes a first contact proximate a first end of the doped polysilicon structure and a second contact proximate a second end of the doped polysilicon structure.

9. The electronic device of claim 6, wherein the capacitor includes a second capacitor plate that is spaced apart from the first capacitor plate along the third direction, the second capacitor plate includes conductive metal.

10. The electronic device of claim 1, wherein the second isolation structure is formed after the first isolation structure.

11. A semiconductor device, comprising:
a semiconductor layer;
a first isolation structure in a trench of the semiconductor layer, the first isolation structure including a dielectric material with a first side on a surface of the trench, a second side opposite the first side, and an indent extending into the first side, wherein:
the indent includes a material of the semiconductor layer; and
an end of the indent is spaced apart from the second side by a distance less than a first thickness of the dielectric material; and
a second isolation structure spaced apart from the first isolation structure, the second isolation structure including a thermally grown dielectric material having the material of the semiconductor layer and having a second thickness less than the first thickness.

12. The semiconductor device of claim 11, wherein the distance is 20 nm or more.

13. The semiconductor device of claim 11, wherein the first thickness is 350 nm or more.

14. The semiconductor device of claim 11, wherein the second thickness is greater than the distance.

15. The semiconductor device of claim 11, wherein the second isolation structure is formed after the first isolation structure.

16. The semiconductor device of claim 11, further comprising:
a passive component including a polysilicon structure on the second side of the dielectric material.

17. The semiconductor device of claim 16, wherein the passive component is a resistor.

18. The semiconductor device of claim 17, wherein the resistor includes a first contact near a first end of the polysilicon structure and a second contact near a second end of the polysilicon structure.

19. The semiconductor device of claim 16, wherein the passive component is a capacitor, and the polysilicon structure is a first plate of the capacitor.

20. The semiconductor device of claim 19, further comprising:
   a second plate of the capacitor spaced apart from the first plate, wherein:
      the second plate has conductive metal; and
      a footprint of the second plate at least partially overlaps the first plate.

21. The semiconductor device of claim 11, further comprising:
   a field effect transistor spaced apart from the first isolation structure, the field effect transistor including a polysilicon gate.

22. The semiconductor device of claim 21, further comprising:
   a passive component including a polysilicon structure on the second side of the dielectric material, wherein the polysilicon structure is concurrently formed with the polysilicon gate.

* * * * *